US006208044B1

(12) United States Patent
Viswanadham et al.

(10) Patent No.: US 6,208,044 B1
(45) Date of Patent: \*Mar. 27, 2001

(54) REMOVABLE MEDIA EJECTION SYSTEM

(75) Inventors: Krishna Viswanadham, Mountain View; David Law, Burlingame; Dennis Boyle, Palo Alto; Matt Herron, Menlo Park, all of CA (US)

(73) Assignee: Apple Computer, Inc., Cupertino, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/969,374

(22) Filed: Nov. 13, 1997

Related U.S. Application Data

(60) Division of application No. 08/367,065, filed on Dec. 30, 1994, now Pat. No. 5,818,182, which is a continuation-in-part of application No. 08/107,185, filed on Aug. 13, 1993, now Pat. No. 5,466,166.

(51) Int. Cl.[7] ..................................................... H02N 10/00
(52) U.S. Cl. .......................... 310/12; 318/135; 318/116; 60/528
(58) Field of Search ............................. 310/12; 318/116, 318/135; 439/157, 159; 60/528

(56) References Cited

U.S. PATENT DOCUMENTS

| 4,654,818 | 3/1987 | Wetterau, Jr. ..................... 434/247 |
| 4,700,541 | * 10/1987 | Gabriel et al. ..................... 60/528 |
| 4,742,478 | 5/1988 | Nigro, Jr. et al. ................... 361/680 |
| 4,747,887 | 5/1988 | Honma ................................ 148/131 |
| 4,769,764 | 9/1988 | Levanon .............................. 361/680 |

(List continued on next page.)

FOREIGN PATENT DOCUMENTS

| 0344850 | 12/1989 | (EP) . |
| 820214832 | 6/1984 | (JP) . |
| 850133712 | 12/1986 | (JP) . |

(List continued on next page.)

OTHER PUBLICATIONS

Wilson, Ron; "PicoPower eyes hot–docking," Electronic Engineering Times No. 858, p. 14, Jul. 24, 1995.
Morgenstern, David; "Power catches PCI wave with new line of clones," MacWeek vol. 9, No. 36, Sep. 11, 1995.

(List continued on next page.)

Primary Examiner—Karl Tamai
(74) Attorney, Agent, or Firm—Beyer Weaver & Thomas, LLP

(57) ABSTRACT

A media ejection system includes a peripheral unit having a housing, an ejection mechanism, and a memory wire coupled to the ejection mechanism. The system further includes a digital processor for issuing ejection commands, and a controller responsive to the ejection command for controlling a current flow through the memory wire. When sufficient current flows through the memory wire, it contracts to activate the ejection mechanism, thereby ejecting a removable medium (such a PCMCIA card) from the housing of the peripheral unit. A method of the invention includes the steps of receiving an ejection request, issuing a ejection command in response to the ejection request, where the ejection command includes parameters for controlling current flow through the metal alloy, and electrically energizing the memory alloy in accordance with the parameters such that the memory alloy undergoes a dimensional change to activate a removable medium ejection mechanism.

12 Claims, 5 Drawing Sheets

U.S. PATENT DOCUMENTS

| | | | |
|---|---|---|---|
| 4,788,658 | 11/1988 | Hanebuth | 361/684 |
| 4,884,557 | 12/1989 | Takehana et al. | 128/4 |
| 4,903,222 | 2/1990 | Carter et al. | 361/680 |
| 4,969,830 | 11/1990 | Daly et al. | 439/136 |
| 5,008,805 | 4/1991 | Fiebig et al. | 364/184 |
| 5,030,128 | 7/1991 | Herron et al. | 439/372 |
| 5,032,705 | 7/1991 | Barcheller et al. | 219/211 |
| 5,041,924 | 8/1991 | Blackborow et al. | 360/69 |
| 5,051,101 | 9/1991 | Komatsu | 439/159 |
| 5,107,400 | 4/1992 | Kobayashi | 361/685 |
| 5,117,378 | 5/1992 | Ho | 361/686 |
| 5,126,954 | 6/1992 | Morita | 361/683 |
| 5,159,533 | 10/1992 | Kuang | 361/686 |
| 5,165,897 * | 11/1992 | Johnson | 434/113 |
| 5,175,671 | 12/1992 | Sasaki | 361/686 |
| 5,186,646 | 2/1993 | Pederson | 439/374 |
| 5,192,222 | 3/1993 | Krause et al. | 439/347 |
| 5,199,888 | 4/1993 | Condra et al. | 439/142 |
| 5,212,605 | 5/1993 | Lim et al. | 360/99.06 |
| 5,214,574 | 5/1993 | Chang | 361/680 |
| 5,238,005 * | 8/1993 | Imran | 128/772 |
| 5,297,087 | 3/1994 | Blackborow et al. | 361/685 |
| 5,305,180 | 4/1994 | Mitchell et al. | 361/185 |
| 5,313,596 | 5/1994 | Swindler et al. | 710/101 |
| 5,317,697 | 5/1994 | Husak et al. | 710/103 |
| 5,323,291 | 6/1994 | Boyle et al. | 361/686 |
| 5,325,880 * | 7/1994 | Johnson et al. | 137/1 |
| 5,347,425 | 9/1994 | Herron et al. | 361/686 |
| 5,377,685 * | 1/1995 | Kazi et al. | 128/662.06 |
| 5,386,567 | 1/1995 | Lien et al. | 713/100 |
| 5,444,644 | 8/1995 | Divjak | 702/64 |
| 5,463,261 | 10/1995 | Skarda et al. | 307/131 |
| 5,466,166 | 11/1995 | Law et al. | 439/159 |
| 5,473,499 | 12/1995 | Weir | 361/58 |
| 5,515,515 | 5/1996 | Kennedy et al. | 710/103 |
| 5,520,644 * | 5/1996 | Imran | 604/95 |
| 5,526,493 | 6/1996 | Shu | 710/101 |
| 5,531,664 | 7/1996 | Adachi et al. | 600/149 |
| 5,548,782 | 8/1996 | Michael et al. | 710/15 |
| 5,556,370 | 9/1996 | Maynard | 600/151 |
| 5,564,024 | 10/1996 | Pemberton | 710/103 |
| 5,573,413 | 11/1996 | David et al. | 439/159 |
| 5,594,873 | 1/1997 | Garrett | 710/701 |
| 5,594,874 | 1/1997 | Narayanan et al. | 710/104 |
| 5,608,877 | 3/1997 | Sung et al. | 710/104 |
| 5,818,182 * | 10/1998 | Viswanadham et al. | 318/116 |

FOREIGN PATENT DOCUMENTS 2-119588 * 5/1990 (JP).
930097891 11/1994 (JP).

OTHER PUBLICATIONS

"Robot Hand with Shape Memory Musculature," IBM Techincal Disclosure Bulletin, Jun. 1995, vol. 28, No. 1, pp. 302–303.

Dynalloy, Inc–Makers of Dynamic Alloys, Flexinol™ Newsletter.

"Shape Memory Alloys," Raychem Corporation Manual, pp. 1–16, and 35–36.

* cited by examiner

REMOVABLE MEDIA EJECTION SYSTEM

CROSS-REFERENCE TO RELATED APPLICATION

This application is a divisional application of prior U.S. patent application Ser. No. 08/367,065 filed on Dec. 30, 1994, now U.S. Pat. No. 5,818,182, which is a continuation-in-part (CIP) of U.S. patent application Ser. No. 08/107,185 filed Aug. 13, 1993, now U.S. Pat. No. 5,466,166, the disclosures of which are hereby incorporated by reference, entitled "PCMCIA Card Ejection Mechanism", and assigned to the assignee of the present invention, said patent application being incorporated herein by reference in its entirety for all purposes.

BACKGROUND OF THE INVENTION

This invention relates generally to computer peripherals, and more particularly to digital mass storage devices having removable storage media.

Computer systems and other digital processing systems often include digital memory "peripherals" used for the mass storage of data, Examples of such digital memory peripherals include hard disk drives, floppy disk drives, optical disk drives, and Personal Computer Memory Card International Association (PCMCIA) cards or devices (also referred to as PC Cards) or other types "flash" memory cards. With some of these peripherals, the storage medium is permanently housed within and forms a part of the peripheral. An example of digital storage peripheral which does not allow the removal of its storage medium is a standard Winchester-type hard disk drive. Other memory peripherals allow the removal and replacement of the digital media. Examples of such peripherals include floppy disk drives and PCMCIA peripheral units.

For most types of storage peripherals with removable media, the media is manually inserted into a slot against spring pressure until a latching mechanism is engaged. In many types of such peripheral units, the media is disengaged from the unit by manually depressing a release button or lever to release the latch and thereby allow the compressed spring to partially eject the storage medium. A protruding end of the medium is then removed from the peripheral unit by hand.

In some computer systems, notably the Macintosh® computer system made by Apple Computer, Inc. of Cupertino, Calif., removable storage media can be automatically ejected by the computer system. More particularly, the Macintosh operating system can cause motors or electrical solenoids of the floppy drive unit to automatically eject a floppy disk.

Such automatic ejection of storage media has several advantages. For one, the computer can prevent the ejection of a floppy disk from the floppy disk drive if the system still needs or is processing data in conjunction with the floppy disk drive. Another advantage is that the floppy disk can be ejected automatically under certain conditions, such as during a power-down or power-up of the computer system. However, such automatic ejection systems have the disadvantage of increasing the cost of the floppy disk drive in that motors or solenoids must be provided, along with their attendant control circuitry.

An increasingly popular form of removable media is the PCMCIA memory card, which is typically a form of "flash" memory. As is well known to those skilled in the art, flash memory is form of non-volatile, solid-state, read-write memory, and PCMCIA cards are flash memory which conform to certain industry standards. Since PCMCIA cards are, themselves, quite small, and since they do not require drive motors or the like (as the case with disk drives) the PCMCIA peripheral unit can be made quite small and lightweight. This makes PCMCIA peripheral units quite attractive for small computers, such as laptop computers, Personal Digital Assistants (PDAs) such at the Newton® PDA, and other small, portable devices utilizing digital processors.

PCMCIA cards can be of other types than the aforementioned flash memory type. For example, there are PCMCIA cards which employ Static Random Access Memory (SRAM) and PCMCIA cards that are miniature hard disk drives. In addition, PCMCIA cards can include modem, cellular pager, and networking capabilities. The PCMCIA format is therefore quite flexible and is rapidly growing in popularity.

For a variety of reasons, in the past, PCMCIA peripheral units only permitted the manual ejection of the PCMCIA cards . For one, the addition of motors or solenoids to eject the PCMCIA card would substantially increase the size of the PCMCIA peripheral unit, which is considered very undesirable. For another, the motor or solenoid would add a significant cost to the PCMCIA peripheral unit.

SUMMARY OF THE INVENTION

The present invention includes a system and method for the automatic ejection of media. More particularly, the present invention includes a system and method for the automatic ejection of PCMCIA cards from PCMCIA peripheral units. This is accomplished using an electrically-controlled "memory wire" to eject a PCMCIA card without the use of motors or solenoids.

A memory wire control system in accordance with the present invention includes elongated memory wire and a pulse width modulator for controlling the electric current flowing through the wire. The electric current heats the wire, causing a dimensional change in the wire that can be used, for example, to release a catch on a PCMCIA peripheral unit to eject a PCMCIA card. The memory wire is preferably a bimetallic alloy comprising nickel and titanium, commonly known by the generic tradename Nitinol. The pulse width modulator is preferably computer controlled so that dimensional changes in the memory wire can be under software control.

A media ejection system of the present invention includes a peripheral unit having a housing receptive to removable medium, an ejection mechanism for ejecting the medium, and a memory wire coupled to the ejection mechanism. The system also includes a digital processor operative to issue a ejection command, and a controller responsive to the ejection command for controlling current flow in the memory wire of the peripheral unit. When the ejection command is received, current flows through the memory wire, causing it to contract, and thereby activating the ejection mechanism of the peripheral unit.

A method for ejecting a removable medium in accordance with the present invention includes the steps of: a) receiving a ejection request; b) issuing a ejection command in response to the ejection request, where the ejection command includes control parameters for a current that is to flow through a memory alloy; and c) passing an electrical current through the memory alloy in accordance with the control parameters so that the memory alloy undergoes a dimensional change to activate a removable medium ejection mechanism. Preferably, the method is computer implemented, and the step of energizing the memory alloy includes applying a pulse width modulated signal to the metal alloy in accordance with the parameters. Also preferably, the parameters included at least one of a duty cycle and a frequency for the pulse width modulated signal.

Since a memory wire or other memory or bimetallic alloy is used to activate the ejection mechanism of the peripheral, the need for motors, solenoids, or other electromagnetic actuators has been eliminated. This greatly reduces the cost of a peripheral unit having an automatic ejection mechanism. Furthermore, the memory wire does not increase the size of the peripheral unit, which is very desirable in view of the increasing miniaturization of computer systems.

These and other advantages of the present invention will become apparent to those skilled in the art upon a reading of the following descriptions of the invention and a study of the several figures of the drawing.

BRIEF DESCRIPTION OF THE DRAWINGS

FIG. 3A is a diagram of a pulse width modulated (PWM) signal that can be applied to the memory wire of the present invention;

DETAILED DESCRIPTION OF THE PREFERRED EMBODIMENTS

Figure 1:
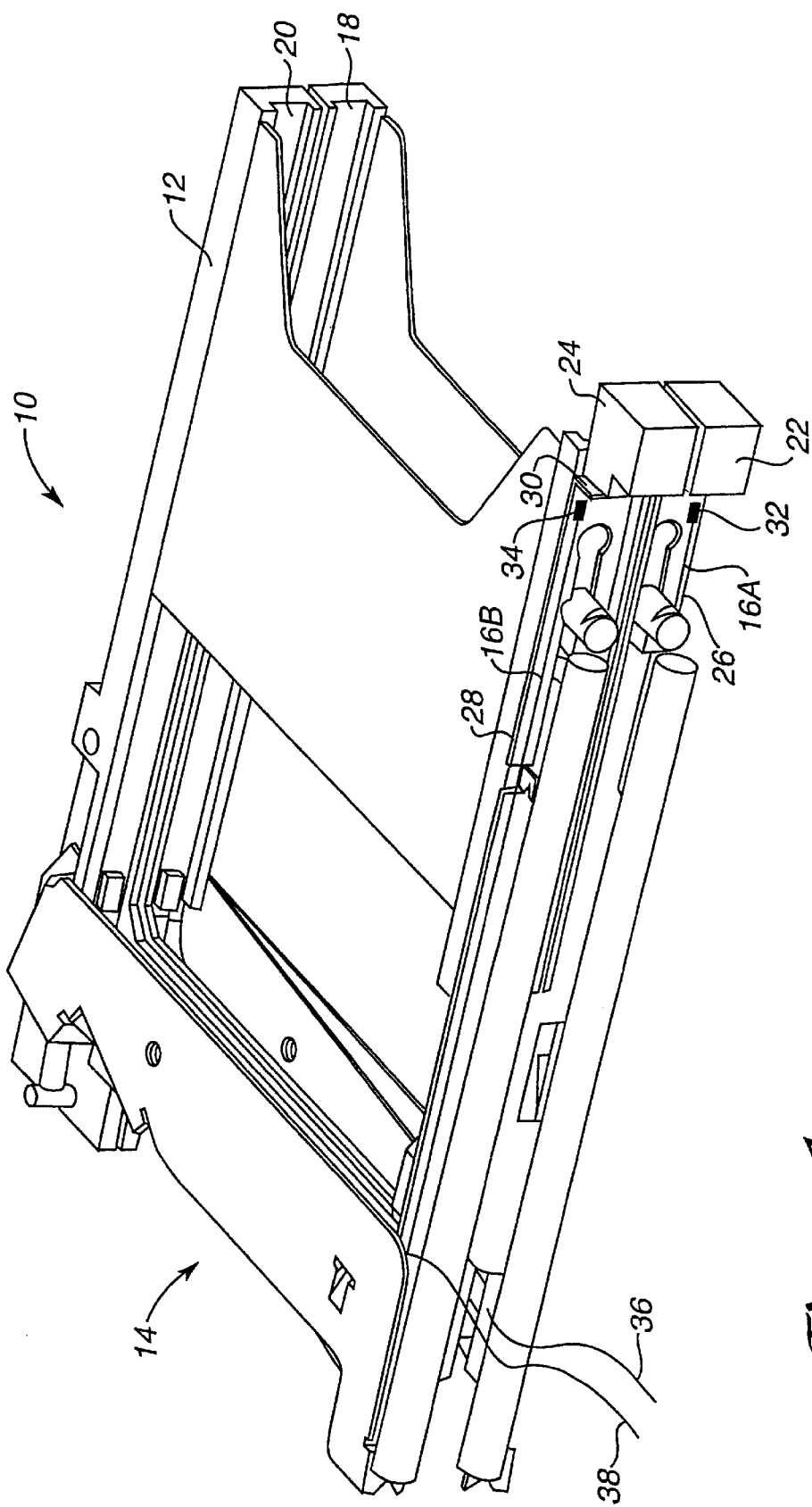
FIG. 1 is a perspective view of a housing for a PCMCIA peripheral unit in accordance with the present invention.

In FIG. 1, a PCMCIA peripheral unit 10 in accordance with the present invention includes a housing 12, an ejection mechanism indicated generally at 14, and memory wires 16A and 16B. The peripheral unit 10 also include other parts well known to those skilled in the art, such as a male connector (not shown) which engages a female connector provided at one end of a PCMCIA card (not shown). A complete description of the housing 12 and ejection mechanism 14 for the peripheral unit 10 can be found in copending U.S. patent application Ser. No. 08/107,185, the disclosure of which has been incorporated herein by reference.

The housing 12 is elongated, rectangular, box-like structure which is capable of simultaneously receiving two PCMCIA cards. A first card may be engaged with a slot 18 of housing 12, and a second card may be engaged with a slot 20 of housing 12. The two PCMCIA cards (not shown) can be inserted and ejected from the housing 12 separately or simultaneously by the ejection mechanism 14. To eject a PCMCIA card from slot 18, an eject button 22 is pressed, and to eject PCMCIA card from slot 20 a button 24 is pressed. Both of the PCMCIA cards can ejected simultaneously by pressing the buttons 22 and 24 at the same time. The buttons 22 and 24 are coupled to the ejection mechanism 14 by unlatch bars 26 and 28, respectively, which slide longitudinally within the housing 12.

Memory wires 16A and 16B of the peripheral unit 10 allow for an automated, software-controlled ejection of PCMCIA cards from slots 18 and 20, respectively. Memory wires 16A and 16B are made from a material exhibiting "shape memory effect", which was first noted over 50 years ago. Preferably, the memory wires 16A and 16b are made from an essentially bi-metallic alloy comprising nickel and titanium, under such trademarks as Flexinol™ by Dynalloy, Inc. of Irvine Calif. or under the generic tradename Nitinol by a number of vendors. The memory wires 16A or 16B of the present invention are approximately 8.4 centimeters long, and have an intrinsic, end-to-end resistance of 1.4 ohms.

Because the memory wires have an intrinsic resistance, a dimensional change in the memory wires 16A and 16B can be made by passing a current though the wires, thereby causing them to heat to degree sufficient to cause a significant contraction of the wire. In other words, the intrinsic resistances of the memory wires 16A and 16B are used as resistance heaters to cause the wires to shrink and to thereby selectively activate the ejection mechanism 14.

Preferably, the memory wires 16A and 16B are anchored at one end to flanges (such as flange 30) of the unlatched bars 26 and 28, respectively, by anchors 32 and 34, respectively, the other end of the memory wire 16 are anchored to a fixed portion of the housing 12. In the present invention, the anchors 32 and 34 are conductive and couple ends of the memory wires 16A and 16B to ground. The anchors going to the fixed portion of the housing should electrically insulate the other ends of the memory wires, such that they are not grounded.

When currents are passed through the memory wires 16A and 16B, their contraction pulls unlatch bars 26 and 28, respectively, towards the ejection mechanism 14, thereby activating the ejection mechanism 14 in the same manner as if the button 22 or 24 respectively, had been pressed. The wires can also be provided in other releasing configurations, such as in a configuration where it pulls directly on a latch plate of the ejection mechanism 14, or where it pulls a wedge between a pair of latch plates of the ejection mechanism 14.

Preferably, first end portions of the wires 16A and 16B are electrically coupled to ground by means of the grounded, metal unlatch bars 26 and 28, respectively, and the other end portions of the wires 16A and 16B (which are not grounded) are connected to control circuitry by wires 36 and 38, respectively. It should be noted that the point of electrical contact between the wires 16A and 16B are preferably at, or approximate to, its two ends. However, alternate embodiments of the present invention may have coupling points located at some distance from the two ends such that only a more central portion of the wire is electrically heated.

Figure 2:
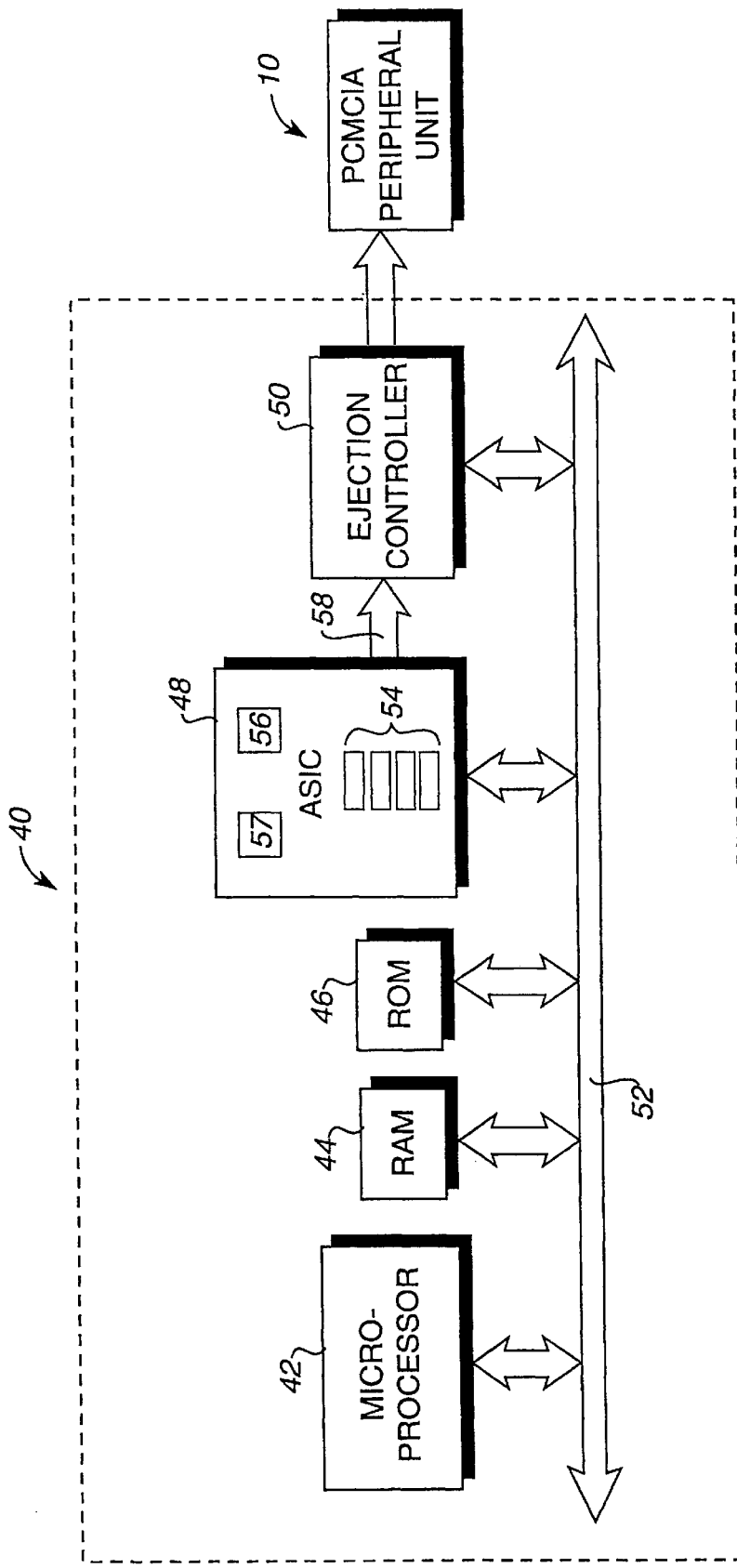
FIG. 2 is a block diagram of a computer system with a digital storage peripheral unit in accordance with the present invention.

In FIG. 2, a digital computer system 40 is shown attached the PCMCIA peripheral unit 10. The digital computer system 40 includes a microprocessor 42, Random Access Memory (RAM) 44, Read Only Memory (ROM) 46, an Application Specific Integrated Circuit (ASIC) 48, and an ejection controller 50. The majority of the components of the computer system 40 communicate with each other, either directly or indirectly, by means of a system bus 52, as is well known to those skilled in the art.

The microprocessor 42, RAM 44, and RAM 46 operate in a conventional manner which need not be described herein. The ASIC 48 (which is often referred to as "chip set") provides much of the functionality of the computer 40 as far as providing control signals for RAM 44 and ROM 46, peripheral control signals for the peripheral unit 10, etc. In the present invention the ASIC 48 includes four registers 54 that store parameters used to control the current flowing through the memory wires of the peripheral unit 10. In addition, the ASIC 48 includes a timer circuit 56 which provides pulse width modulation (PWM) signals for the ejection controller 50, and a free-running counter 57 which is used to time timeouts. It should be noted that the ASIC 48 provides a great deal functionality, only a small part of which is related to the ejection of PCMCIA cards. Again, such functionality is well known to those skilled in the art of ASIC and chip set design.

Figure 3:
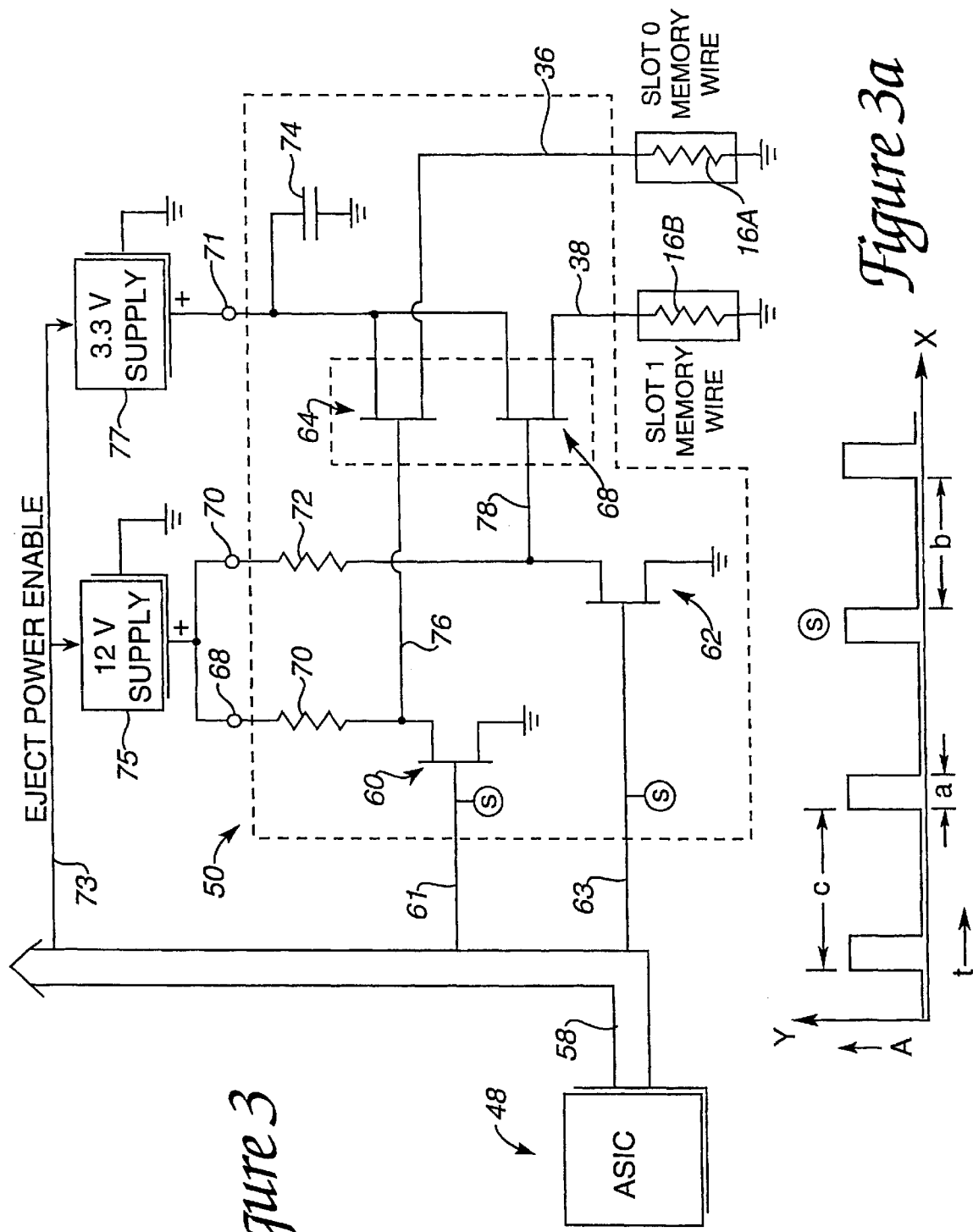
FIG. 3 is a schematic of the ejection controller 50 of FIG. 2.

In FIG. 3, the ejection controller 50 is illustrated in greater detail. As noted, the ejection controller 50 is coupled to ASIC 48 by a bus 58 which provides various signals to the ejection controller 50. One of these signals is a PWM signal S, which can be used to control current flow in either or both of memory wires 16A and 16B. An exemplary waveform of the signal S is illustrated in FIG. 3A and will be discussed in greater detail subsequently. Another signal on bus 58 is the "Eject Power Enable" signal, which will also be discussed in greater detail subsequently.

The controller 50 includes Metal Oxide Semiconductor Field Effect Transistors (MOSFETS) 60, 62, 64, and 68. These MOSFETS can be discrete MOSFET devices or they can be partially or wholly integrated. For example, MOSFET 64 and 68 are preferably provided as a MOSFET SI9956 device available from Siliconix of Santa Clara, Calif. In the present implementation, MOSFETS 60 and 62 are discrete transistors devices, such as a 2N7002 transistors available from Motorola of Schaumberg, Ill. The gates of MOSFET 60 and 62 are coupled to bus 58 by lines 61 and 63, respectively, and the sources of MOSFET 60 and 62 are coupled to ground. The drain of MOSFET 60 is coupled to a node 68 by a resistor 70, and the drain of MOSFET 62 is coupled to a node 70 by a resistor 72. Resistors 70 and 72 are preferably about 100 kΩ resistors and nodes 68 and 70 are coupled to a positive terminal of a 12 volt power supply. The drain of MOSFET 60 is coupled to the gate of MOSFET 64, and the drain of MOSFET 62 is coupled to the gate of MOSFET 68. The drains of both MOSFETS 64 and 68 are coupled to a node 71 and to one terminal of a 10 μF capacitor 74. The other terminal of the capacitor 74 is grounded, and the node 71 is coupled to a 3.3 volt power supply. The source of MOSFET 64 is coupled to one end of slot 0 memory wire 16A by wire 36 (see also FIG. 1), and the source of MOSFET 68 is coupled to one end of the slot 1 memory wire 16B by wire 38 (see also FIG. 1). The other end of the memory wires are grounded, as described previously.

As seen in FIG. 3A, the signal S as created by timer 56 and carried by bus 58 is preferably a series of square waves. One cycle of the series of square waves is shown at C. The amplitude A of the square wave is taken along the Y axis, and typically it varies between 0 and 5 volts dc. Time t is shown along the X axis. The frequency of signal S is measured in cycles in per second or hertz which is equal to C/Δt, where Δt is the time t for one cycle C. It should be noted that a cycle need not be symmetrical. For example, cycle C in this illustration has a high value for a period of time a, and low value for period of time b. In the present invention, the memory wire 16A and/or 16B are electrically energized when the signal S is low (e.g. 0 volts) and are not energized when the signal S is high (e.g. 5 volts) due to a subsequent inversion stage to be discussed subsequently. Therefore, a "duty cycle" for the signal S is equal to b/c, which corresponds to the percentage of time that a current is being passed through a memory wire after the inversion of the signal S is applied to the memory wire.

As mentioned previously, the signal S can be applied to MOSFET 60 via a line 61, or to MOSFET 62 via a line 63. The ASIC 48 makes the determination which of lines 61 and 63 are to carry the signal S. Alternatively, the signal S can be applied to both lines 61 and 63 simultaneously, if the power supplies are sufficient to provide the necessary current to operate memory wires 16A and 16B simultaneously.

Memory wire 16A and 16B can be activated either singly, or in combination. Of course, if they are to be activated simultaneously, the power supplies must be of sufficient capacity so that the system is not adversely affected by the relatively large current drain. The activation of wire 16A will be discussed, it being understood that memory wire 16B can be activated in an analogous fashion.

To electrically energize the wire 16A such that it contracts and activates the ejection mechanism 14 to force the ejection of a PCMCIA card engaged with slot 0, the following sequence of events occur. First, an EJECT POWER ENABLE signal on a line 73 activates a 12 volt power supply 75 and a 3.3 volt power supply 77 in response to an "EJECT POWER" parameter. Next, timer circuit 56 of ASIC 48 is activated in response to an "EJECT COMMAND" parameter to produce the signal S on line 61. In consequence, the MOSFET 60, serves as amplifying inverter or inversion stage, in that when the signal at the gate of MOSFET 60 is low (0 volts) the voltage on line 76 will be high (+12 volts), and when the signal on the gate of MOSFET 60 is high (+5 volts) the MOSFET 60 will turn on causing the voltage on line 76 to go low (0 volts). The reason that this relatively high voltage (i.e. 12 volt) signal MOSFET 60 is that the power MOSFET 64 needs a gate enhancement (i.e. a gate-to-drain potential) of at least 4.5 volts to turn on. Since the drain is at 3.3 volts, this requires a minimum of 7.8 volts to be applied to the gate. Since the computer system of the present invention includes a 12 volt power supply, it is convenient to use this supply to control the gate of MOSFET 64.

Power MOSFET 64 passes a considerable amount of current to the memory wire 16A when activated via a +12 voltage level on line 76. To limit the maximum current, a relatively low voltage level of 3.3 volts has been chosen, which is also available in the system. This 3.3 volt supply is considered safer than using a 5 volts supply (which is also available in the system) because the maximum current through the memory wire is more limited. This reduces the chance of overheating the memory wire 16A, with possible melt-down and system failure.

With reference to MOSFET 64, the signal on line 76 will turn on MOSFET 64 when it is high (+12 volts) and will turn off MOSFET 64 when it is low (0 volts or ground). As mentioned previously, the drain of MOSFETS 64 and 68 are coupled to a 3.3 volt power supply and to a capacitor 74. The capacitor 74 is provided to give a fast surge of current when one or both of the MOSFETS 64 or 68 are activated. When the signal on line 76 is high (12 volts) the MOSFET 64 becomes conductive and the 3.3 volt power supply and capacitor 74 are connected to the power end of memory wire 16A by wire 36, causing a PWM signal to create a current flow in the memory wire 16A. Since the transistor 60 performed an inversion, and since transistor 64 did not perform an inversion, a PWM power waveform S* is created as the inversion of the control signal S and is applied to the memory wire 16A. As mentioned previously, MOSFETS 62 and 68 operate in manner analogous to MOSFETS 60 and 64 to control the current in the memory wire 16B.

Pulse width modulation is the preferred method for energizing the memory wires 16A and 16B because it provides an easy and inexpensive method for controlling the amount of current flow through the memory wires. Programmable timers and counters of the ASIC allow the frequency and duty cycle of this signal S to be modified under software control. Currently, the frequency has been chosen, for convenience, to be 256 kilohertz, and a duty cycle has been chosen to be 64/68. Of course, other frequencies and duty cycles can be selected depending upon the application.

Figure 4:
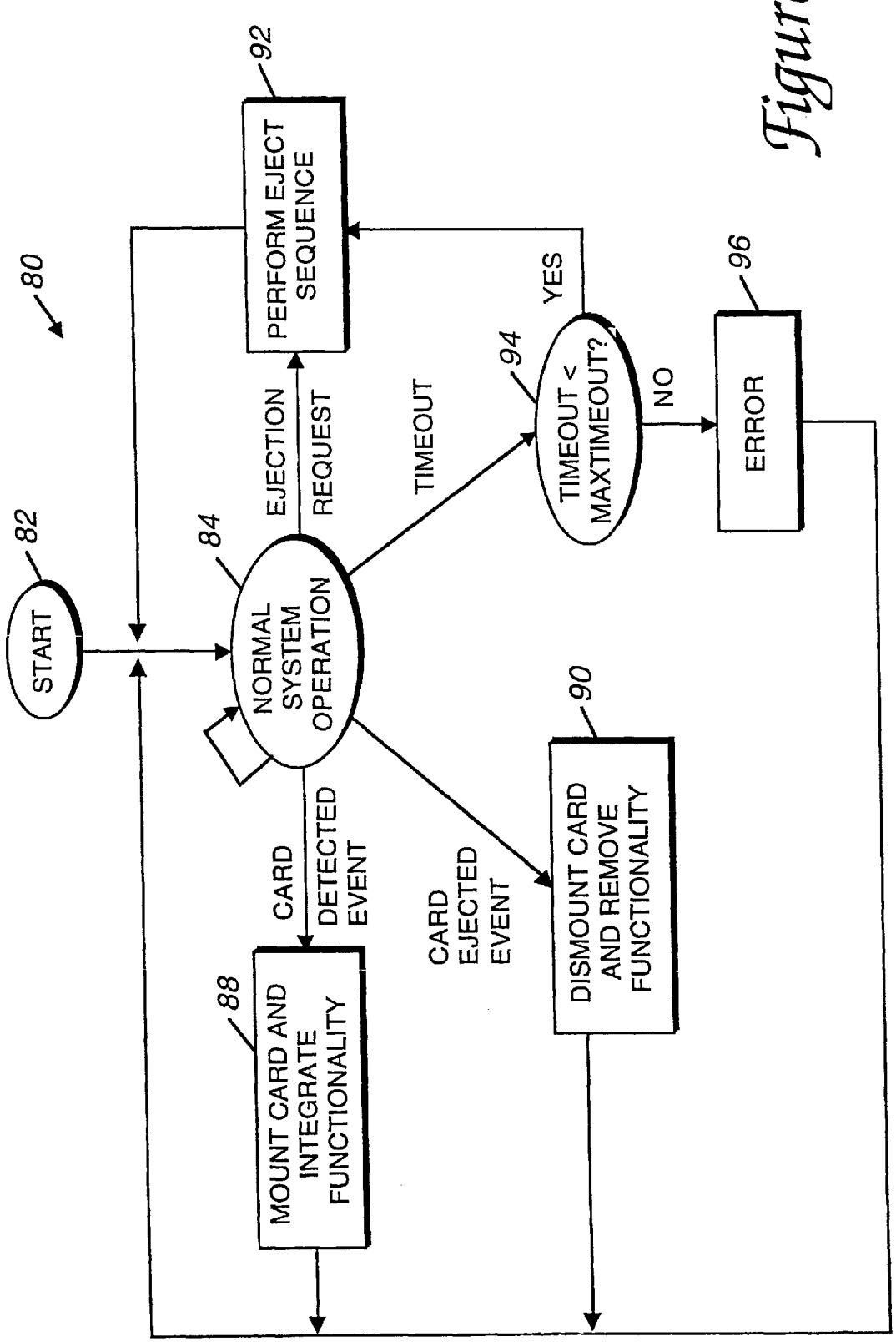
FIG. 4 is a flow diagram of the computer implemented process of the present invention.

FIG. 4 illustrates a computer implemented process 80 running on computer 40 to control the PCMCIA peripheral unit 10. The process begins at 82 with power-up of the system 40, and normal system operations occur in a normal system operation event loop 84. For the purpose of controlling the PCMCIA peripheral unit 10, the process 80 is waiting for one of four events, namely a card detected event, and card ejected event, a timeout event, and ejection request event. As used herein, the term "event" is used loosely to indicate any kind of event, interrupt, or redirection of processing which takes the process 80 out of the normal system operation loop 84. The term "event handler" will also be used loosely to describe software code which responds to an event. For example, an "event handler" can be a traditional event handler, an interrupt handler, a subroutine, etc.

In the case of card detected event, a PCMCIA card has been inserted into a slot of the peripheral unit 10. This is detected by the system, and the card is mounted and integrated functionally into the system in a step 88 by methods well known to those skilled in the art. If a card ejected event has been detected, the card is dismounted and its functionality is removed from the system in a step 90, again in a manner well known to those skilled in the art. After either of steps 88 or 90 are performed, process control is returned to the event loop 84.

If a ejection request is detected, an eject sequence is performed in a step 92, and then process control is returned to the normal system operation loop 84. It should be noted that the ejection request can be initiated by a user, or may be initiated independently and/or automatically by the computer system.

If a timeout is detected, a decision step 94 determines whether this timeout (TIMEOUT) is less than the maximum timeout (MAXTIMEOUT) and, if so, step 92 is performed. Otherwise, an error message is developed at 96 and process control is returned to the normal system operation event loop 84. Typically, MAXTIMEOUT will be set to 2 such that the system attempts to eject twice before giving the error in step 96.

Figure 5:
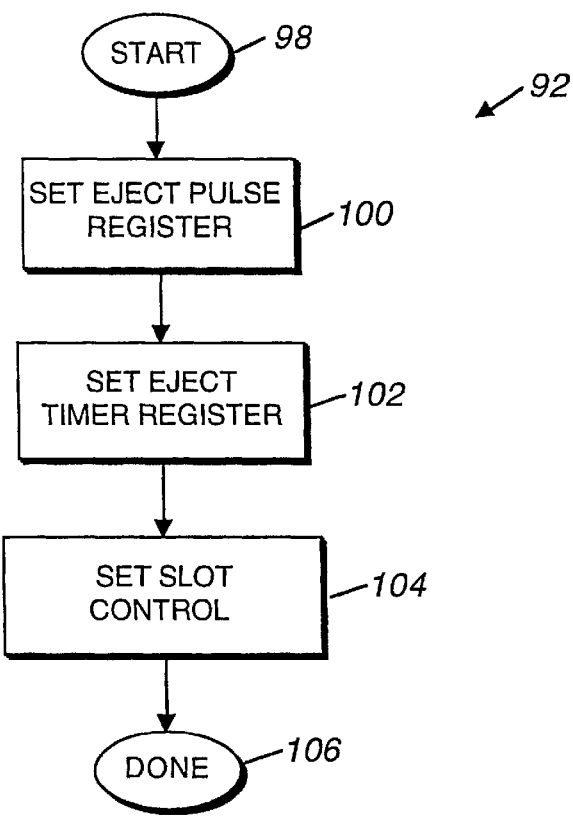
FIG. 5 is a flow diagram of the illustrating the "performed eject sequence" step of FIG. 4 in greater detail.

The eject sequence step 92 is illustrated in greater detail in FIG. 5. The process starts at 98 and, in a step 100 the eject pulse register is set. Next, in a step 102, the eject timer register is set, and in a step 104 the slot control register is set. These parameters will control the way in which current is applied to the memory wires. The process 92 is completed at 106, at which time process control is returned to the normal system operation 84 as described previously.

Figure 5A:
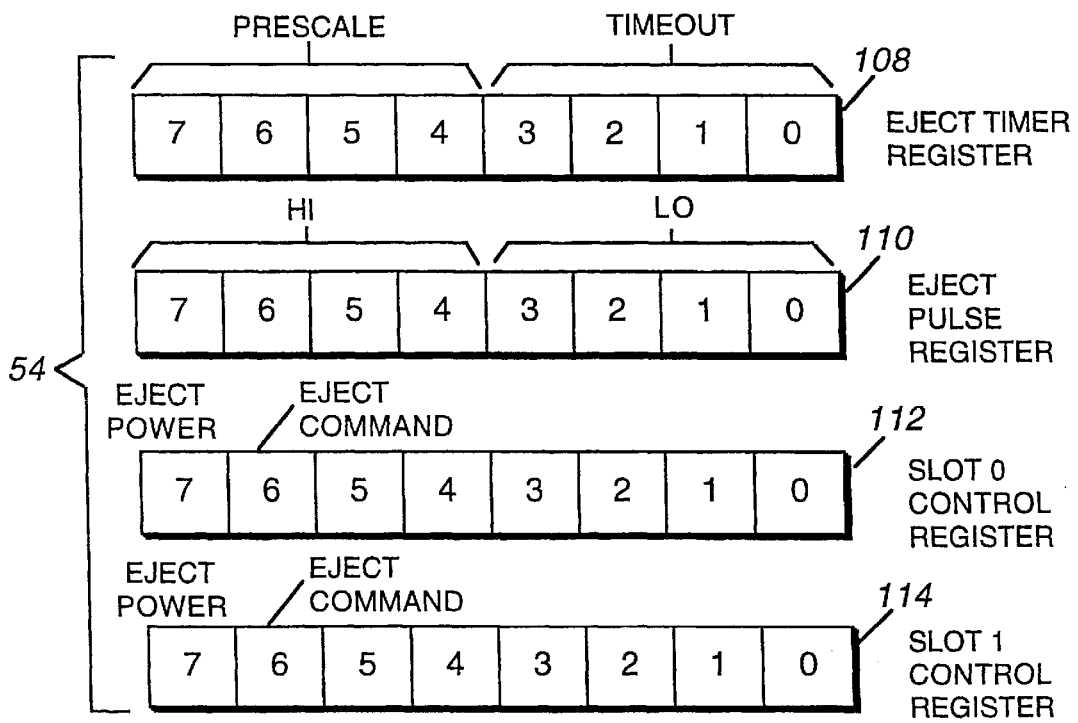
FIG. 5A is an illustration of various programmable registers used by the present invention.

The registers 54 of ASIC 48 are illustrated in greater detail in FIG. 5A. The registers 54 include an eject timer register 108, an eject pulse register 110, a slot 0 control register 112, and slot 1 control register 114. In the eject timer register 108, the lowest 4 bits (3::0) program the timeout period in seconds, while the upper 4 bits (7::4) program the prescale value. A typical number of seconds for the timeout is three seconds, and a typical value for the prescale value is one. The timeout period, which is loaded into free-running timer 57 of ASIC 48 which creates the timeout event of FIG. 4, can be from 1 to 16 seconds in the present embodiment of this invention. Likewise, the prescale value, which sets the frequency of the signal S, can be set from 1 to 16, and is used to divide a clock signal provided to the timer 56 by the ASIC 48.

For eject pulse register 110, the lowest 4 bits (3::0) program the low pulse, while the top 4 bits (7::4) program the high pulse. For the slot 0 control register and slot 1 control register only bits 6 and 7 are used. Bit 6 is the eject power which activates the +12 volt power supply at nodes 60 and 70 (see FIG. 3). Bit 7 is the eject power command, either one of which will turn on the timer circuit 56.

It is therefore apparent that the process 92 of FIG. 5 controls the current flowing through the memory wires 16A and 16B. The parameters set in the registers 54 provide a control over the duty cycle and frequency of signal S and the appropriate timeout period. Once these parameters have been set, one or both of the slot ejection mechanisms can be activated by bits 6 and 7 of registers 112 and 114.

It is considered important to provide both an eject command and eject power bit in the slot control registers 112 and 114. This because of a single device (such as MOSFET) can always fail, which could cause an excess amount of current to flow through the memory wire 16A and/or 16B, thereby possibly damaging the peripheral unit or presenting a safety hazard. Therefore, by having, basically, two "switches" (i.e. an eject command bit and an eject power bit) that must be activated in order to apply a power waveform to the memory wire 16A and 16B, the chance for an accidental over-heating of the memory wires is virtually illuminated.

As used herein, "switches", "gates", "MOSFETS", "transistors", "registers" and the like are often used synonymously to refer to devices which can switch or gate signals or control the switching or gating of signals. For example, a two-input NAND gate can be used in place of a switch by using one of the inputs to the NAND gate for a signal, and by using the other input of the NAND gate as the switch activation signal.

While this invention has been described in terms of several preferred embodiments, it is contemplated that alternatives, modifications, permutations and equivalents thereof will become apparent to those skilled in the art upon a reading of the specification and study of the drawings. For example, the ejection mechanism can be used to eject other forms of digital and analog removable media, such as cassette tapes, videotapes, compact discs (CDs), etc., from their players. It is therefore intended that the following appended claims include all such alternatives, modifications, permutations and equivalents as fall within the true spirit and scope of the present invention.

What is claimed is:

1. A memory wire control system used to eject a removable medium from a housing, said memory wire control system comprising:

an elongated memory wire having a first end and a second end and an intrinsic electrical resistance; and a pulse width modulator having a first output coupled to a first coupling location of said memory wire that is more proximate said first end than said second end and a second output coupled to a second coupling location of said wire that is more proximate to said second end than said first end, said pulse width modulator being operative to provide a pulse width modulated current to said memory wire, thereby causing said memory wire to heat due to said intrinsic electrical resistance and consequently causing said memory wire to contract between said first coupling portion and said second coupling portion due to said heating, whereby when said memory wire is caused to contract, said removable medium is caused to ejected from said housing.

2. A memory wire control system as recited in claim 1 wherein said memory wire is an alloy comprising nickel and titanium.

3. A memory wire control system as recited in claim 1 wherein said pulse width modulator is a portion of a digital controller.

4. A memory wire control system used to eject a removable medium from a housing, said memory wire control system comprising:

an elongated memory wire having a first end and a second end and an intrinsic electrical resistance; and a digital controller including a pulse width modulator having a first output coupled to a first coupling location of said memory wire that is more proximate said first end than said second end and a second output coupled to a second coupling location of said wire that is more proximate to said second end than said first end, said pulse width modulator being operative to provide a pulse width modulated current to said memory wire, thereby causing said memory wire to heat due to said intrinsic electrical resistance and consequently causing said memory wire to contract between said first coupling portion and said second coupling portion due to said heating, whereby when said memory wire is caused to contract, said removable medium is caused to ejected from said housing, wherein said digital controller includes at least one register that is programmable under software control, the operation of said pulse width modulator being controlled by said digital controller in accordance with at least one parameter stored in said at least one register.

5. A memory wire control system as recited in claim 4 wherein said at least one parameter is a duty cycle for the pulse with modulated current produced by said pulse width modulator.

6. A memory wire control system as recited in claim 5 wherein said pulse width modulator is responsive to at least a second parameter which is a frequency for the pulse with modulated current produced by said pulse width modulator.

7. A memory wire control system as recited in claim 4 wherein said at least one parameter is a frequency for the pulse with modulated current produced by said pulse width modulator.

8. A memory wire control system as recited in claim 4 wherein said digital controller includes a microprocessor, and wherein said microprocessor is responsive to an activation request, and is capable of issuing an activation command in response thereto.

9. A memory wire control system as recited in claim 8 wherein said memory wire activation command is stored in said at least one register.

10. A memory wire control system as recited in claim 9 further comprising a gate controlled by said memory activation command and coupled between said pulse width modulator and said memory wire.

11. A memory wire control system as recited in claim 10 wherein said memory activation command is further operative to activate said pulse width modulator.

12. A memory wire control system as recited in claim 9 wherein said activation command is operative to activate said pulse width modulator.

* * * * *